United States Patent [19]

Vo

[11] Patent Number: 4,870,605
[45] Date of Patent: Sep. 26, 1989

[54] REMOVABLE DATA CARTRIDGE FOR A COMPUTER SYSTEM

[75] Inventor: Cong T. Vo, San Jose, Calif.

[73] Assignee: Cromemco, Inc., Calif.

[21] Appl. No.: 148,968

[22] Filed: Jan. 27, 1988

[51] Int. Cl.⁴ .......................... G06F 1/00; H02B 1/00
[52] U.S. Cl. ..................................... 364/708; 361/380
[58] Field of Search ............... 364/708, 900 MS File; 361/380, 390, 392–395, 399–400; 439/40, 298

[56] References Cited

U.S. PATENT DOCUMENTS

| | | | |
|---|---|---|---|
| 4,672,511 | 6/1987 | Meusel et al. | 361/380 |
| 4,715,385 | 12/1987 | Cudahy et al. | 364/708 |
| 4,754,397 | 6/1988 | Varaiya et al. | 364/708 |

Primary Examiner—Gary V. Harkcom
Assistant Examiner—Long T. Nguyen
Attorney, Agent, or Firm—Paul Hentzel

[57] ABSTRACT

A removable data cartridge is mounted in a data station cavity on a main computer. The cartridge has a securing bolt extending therethrough for securing the cartridge to the main computer. The bolt is turned by a knob on the front panel of the cartridge. The other end of the bolt engages a threaded aperture in the cavity. The cavity has indexing pins which engage indexing holes in the cartridge for permitting only the installation of cartridges compatible with the main computer. A solenoid mounted with the cartridge has a sliding pin for locking the cartridge into the cavity when the system is energized.

26 Claims, 4 Drawing Sheets

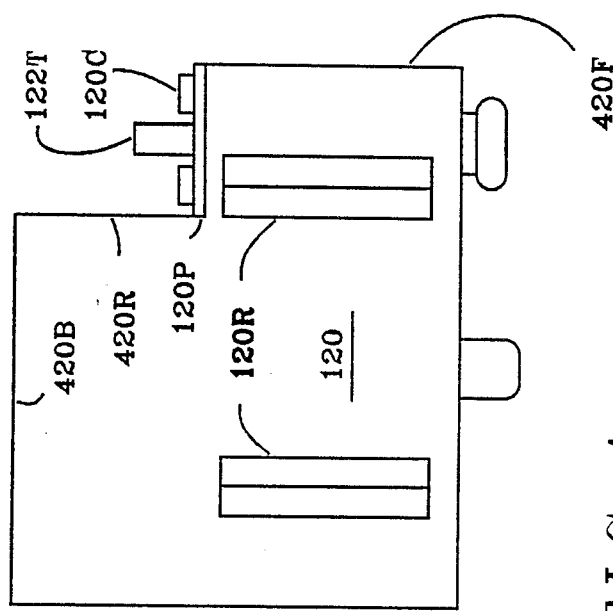
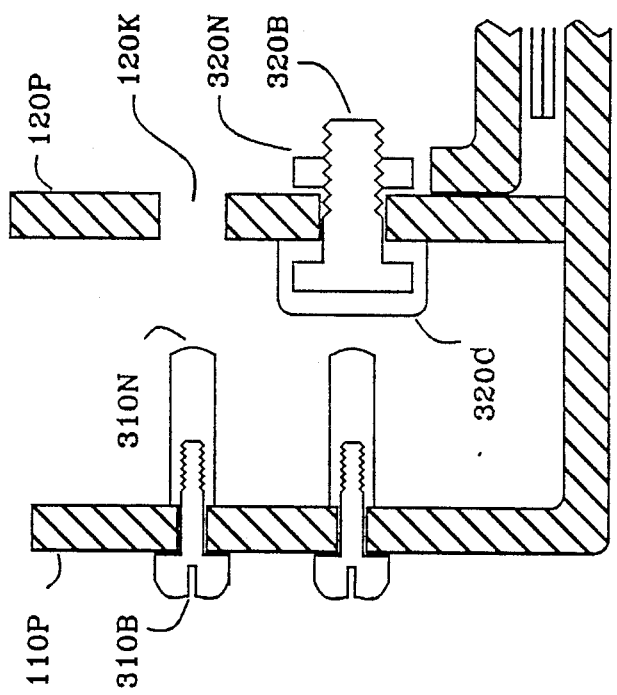
FIG 4
FIG 3

REMOVABLE DATA CARTRIDGE FOR A COMPUTER SYSTEM

TECHNICAL FIELD

This invention relates to security for computer data bases contained in a removable cartridge, and more particularly to such data cartridges at work locations remote from the central secured location for permanent storage of the data bases.

BACKGROUND OF THE INVENTION

Heretofore data bases containing confidential information have been secured by storing and using them at a primary or central secured facility. Typically such secured areas also contained a major computer installation with security personnel. Unsecured field operations remote from the central secured area did not have direct access to the data base. The data bases were maintained under security, and could only be moved to another secured area. This lack of direct access hampered the field operations.

SUMMARY

It is therefore an object of this invention to provide a secured data base for storage and use at remote work locations.

It is another an object of this invention to provide a such a secured data base which is mechanically coded to prevent installation into an incompatible main computer unit.

It is further an object of this invention to provide a such a secured data base in a portable vault like cartridge which is removed from the main computer unit after each work session.

It is further an object of this invention to provide a such a secured data base cartridge which cannot be removed from the main unit during a work session.

It is further an object of this invention to provide a such a secured data base cartridge which readily permits hardware modification of the cartridge.

It is further an object of this invention to provide a such a secured data base cartridge in which the interface elements are protected when the cartridge is removed from the main computer unit.

Briefly, these and other objects of the present invention are accomplished by providing a computer system having a computer unit with a data transfer station, and a cartridge which may be removably mounted on the computer unit at a data transfer station. The cartridge has an operator accessible side and a computer interface side. A data section within the cartridge contains a data storage means and a data drive for accessing the data stored in the data storage means. An interface section within the cartridge interfaces with the data transfer station. An initial stop means defines an initial stop position between the cartridge and the data transfer station during the mounting of the cartridge. A rigid securing shaft extends through the cartridge from the operator accessible side to the computer interface side. A knob member is mounted on the operator accessible end of the securing shaft, and a first threaded structure is formed on the computer interface end of the securing shaft. A securing aperture on the computer unit proximate the data transfer station has a second threaded structure formed therein for engaging the first threaded structure on the securing shaft as the knob member is rotated. The the cartridge slowly moves toward the securing aperture for securing the cartridge into the data transfer station. A final stop means defines a final stop position of the cartridge within the data transfer station. A first electrical connector is mounted on the computer interface side of the cartridge, and second electrical connector is mounted on the computer unit proximate the data transfer station for engaging the first electrical connector on the cartridge. The electrical connectors transfer data between the computer and the data section on the cartridge and provide electrical power to the cartridge. The electrical connectors are not fully engaged when the cartridge is in the initial stop position and become fully engaged when the cartridge is in the final stop position.

BRIEF DESCRIPTION OF THE DRAWING

Further objects and advantages of the present secured data base at the remote location will become apparent from the following detailed description and drawing in which:

FIG. 3 is a fragmentary view showing keying pins and keying holes in detail; and FIG. 4 is a top view of the data cartridge showing the indented region for the interface structure.

Figure 1:
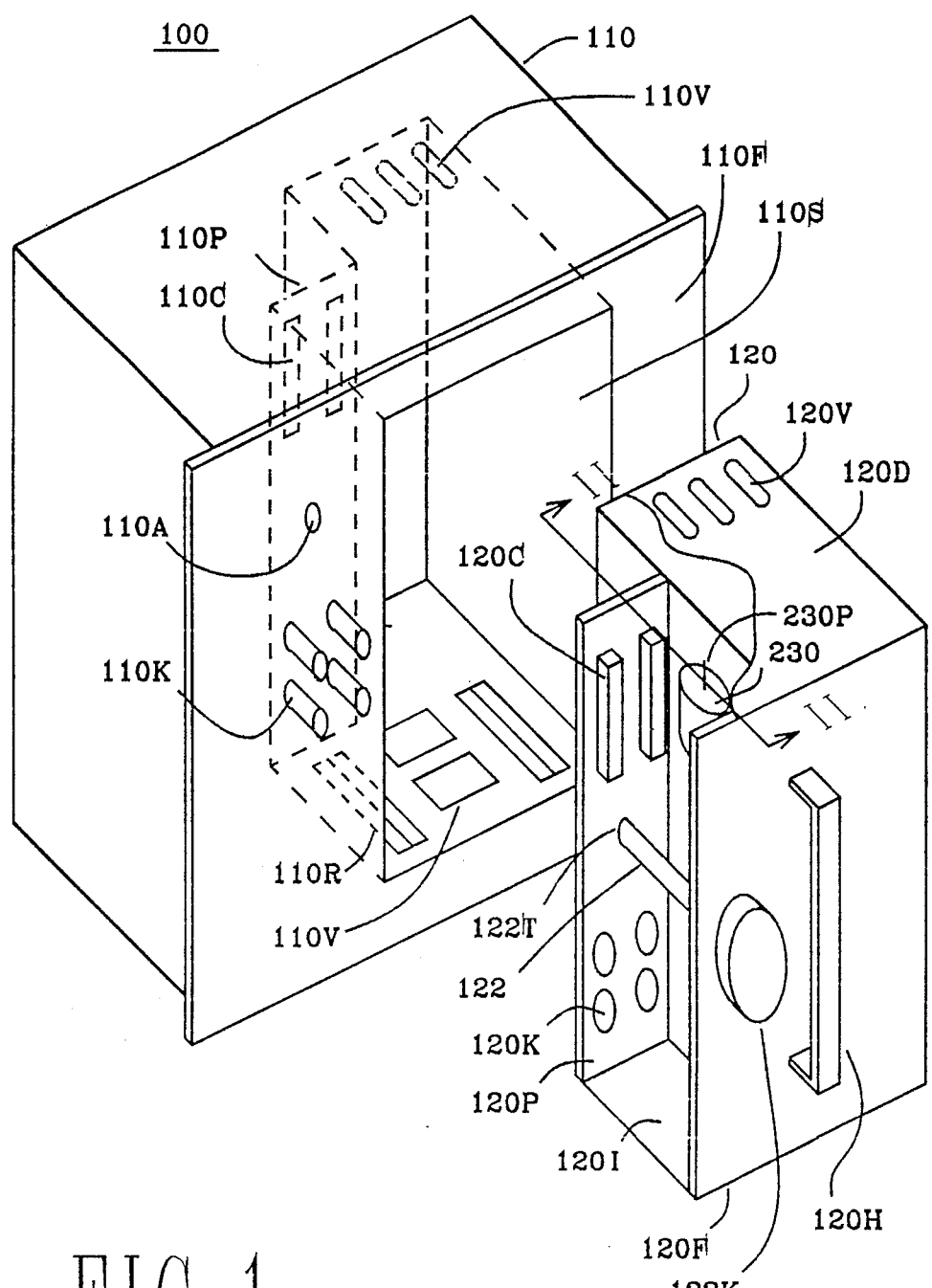
FIG. 1 is a perspective view of a main computer system and a removable data/drive cartridge with the top and side broken away.

Each element of the invention is designated by a three digit reference numeral. The first digit indicates the Figure in which that element is first disclosed or described. The second and third digits indicate like features and structural elements throughout the Figures. Some reference numerals are followed by a letter which indicates a sub-portion or feature of that element.

GENERAL EMBODIMENT (FIG. 1)

Computer system 100 is formed by main computer unit 110 and a removable cartridge unit 120 (see FIG. 1) having an interface section 120I and a deeper data storage section 120D. Data storage section 120D contains a suitable data storage means and access drive such as a hard disk. An operator accessible panel 110F on the front of main unit 110, contains a suitable data station such as cavity 110S for receiving cartridge 120.

A threaded fastening device such as securing rod 122 extends through the cartridge from knob 122K on the front panel 120F of cartridge housing to rear interface plate 120P of cartridge housing. Rod 122 fastens to the main unit for securing the cartridge within the cavity during operation. Threaded end 122T on rod 122 extends beyond interface plate 120P to engage a threaded aperture structure 110A on rear interface wall 110P of the cavity lining.

Indexing or keying pins 110K extending from interface wall 110P of the cavity cooperate with indexing holes 120K in interface plate 120P of the cartridge. This indexing protection prevents the installation of cartridges into an incompatible main units.

Electrical connectors 120C on interface plate 120P of the cartridge housing engage corresponding electrical connectors 110C on cavity interface wall 110P. The electrical connectors provide energizing power to the cartridge and permit data transfer between the cartridge and the main unit.

A suitable locking device such as solenoid 230 is provided to lock the cartridge within the cavity while the power to the main computer unit is on. The locking is accomplished by a locking pin 230P within the solenoid which slides upward when the solenoid is energized. When in the locked position, the pin extends through the top surface of the cavity housing and through the top wall of the cavity lining.

The housing for the cartridge has air ports or vents 120V in registration with air vents 110V within cavity 110S for permitting the flow of cooling air through the interior of the cartridge. The housing surfaces of the cartridge and the lining walls of the cavity form a double electrical shield for minimizing electrical interference.

Guide rails 110R on the floor of cavity 110S engage cooperating guide rails 120R on the bottom of cartridge 120 for guiding the cartridge into the cavity. The guide rails assist in aligning the electrical connectors and aligning threaded end 122T of rod 122 with threaded aperture 110A during installation. In addition, the rails prevent vertical shifting of the cartridge within the cavity during and after installation (see FIG. 2C).

CARTRIDGE INSTALLATION (FIGS. 2A-2B-2C)

In order to mount the removable cartridge into the main computer unit, the operator holds the cartridge by support handle 120H located on cartridge housing front panel 120F which is operator accessible. Handle 120H is preferably vertical to permit wrist support. The operator may provide additional support during installation of the cartridge by placing his other hand along bottom surface 120B of the cartridge housing. The operator then rests bottom surface 120B on the cavity floor along the cavity opening; and slowly slides the cartridge toward the rear of the cavity engaging the over hanging portion of guide rail 110R on the floor of the cavity with the under hanging portion of guide rail 120R on the bottom of the cartridge. The cartridge slides the remainder of the distance to the rear of the cavity on the guide rails. Threaded tip 122T enters a guide aperture 110G in cavity interface wall 110P, and strikes threaded aperture structure 110A.

INITIAL CARTRIDGE POSITION (FIG. 2A)

Figure 2A:
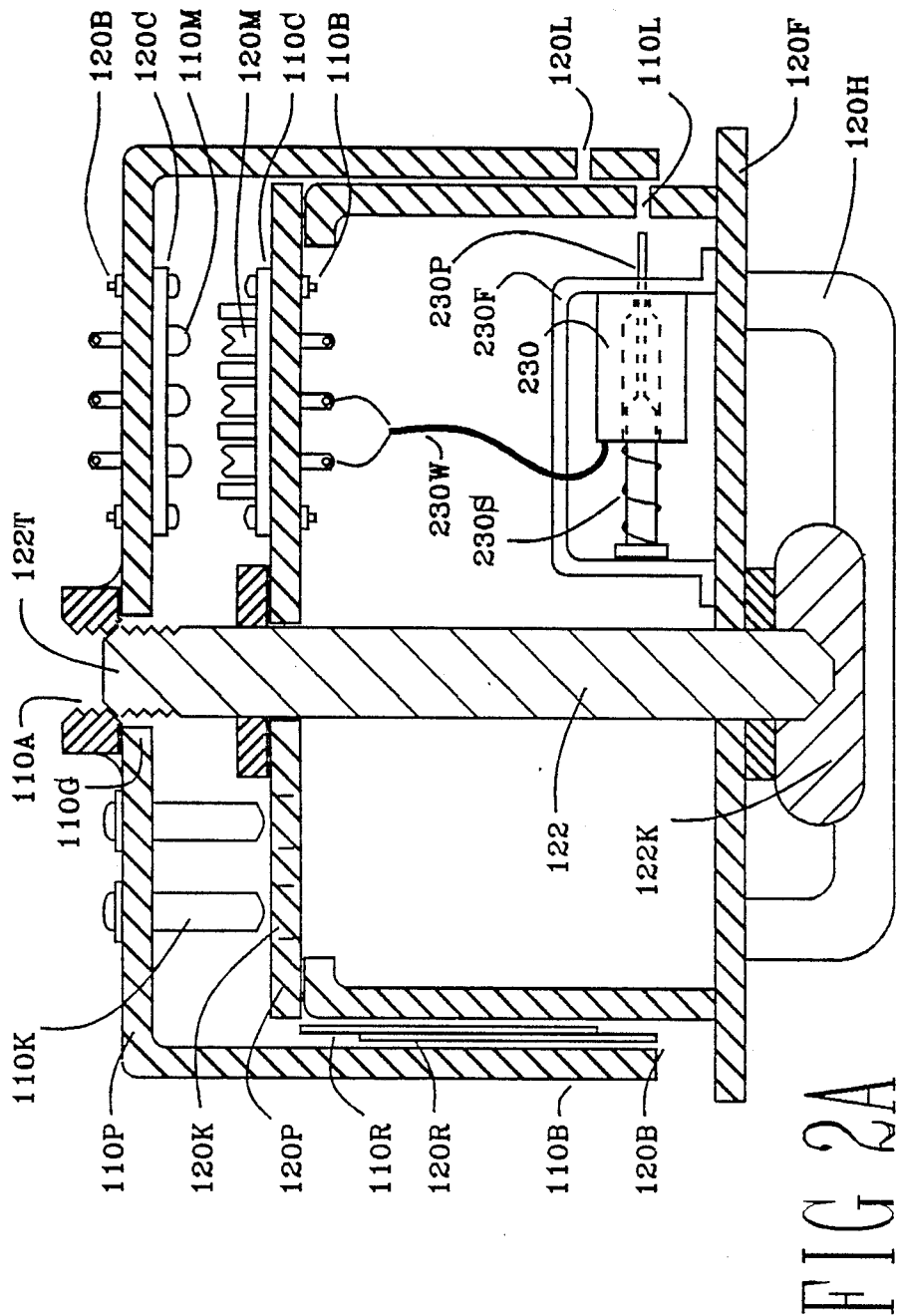
FIG. 2A is a side view in section along lines II—II of FIG. 1 showing the cartridge during installation in the initial stop position.
Figures 2B, 2C:
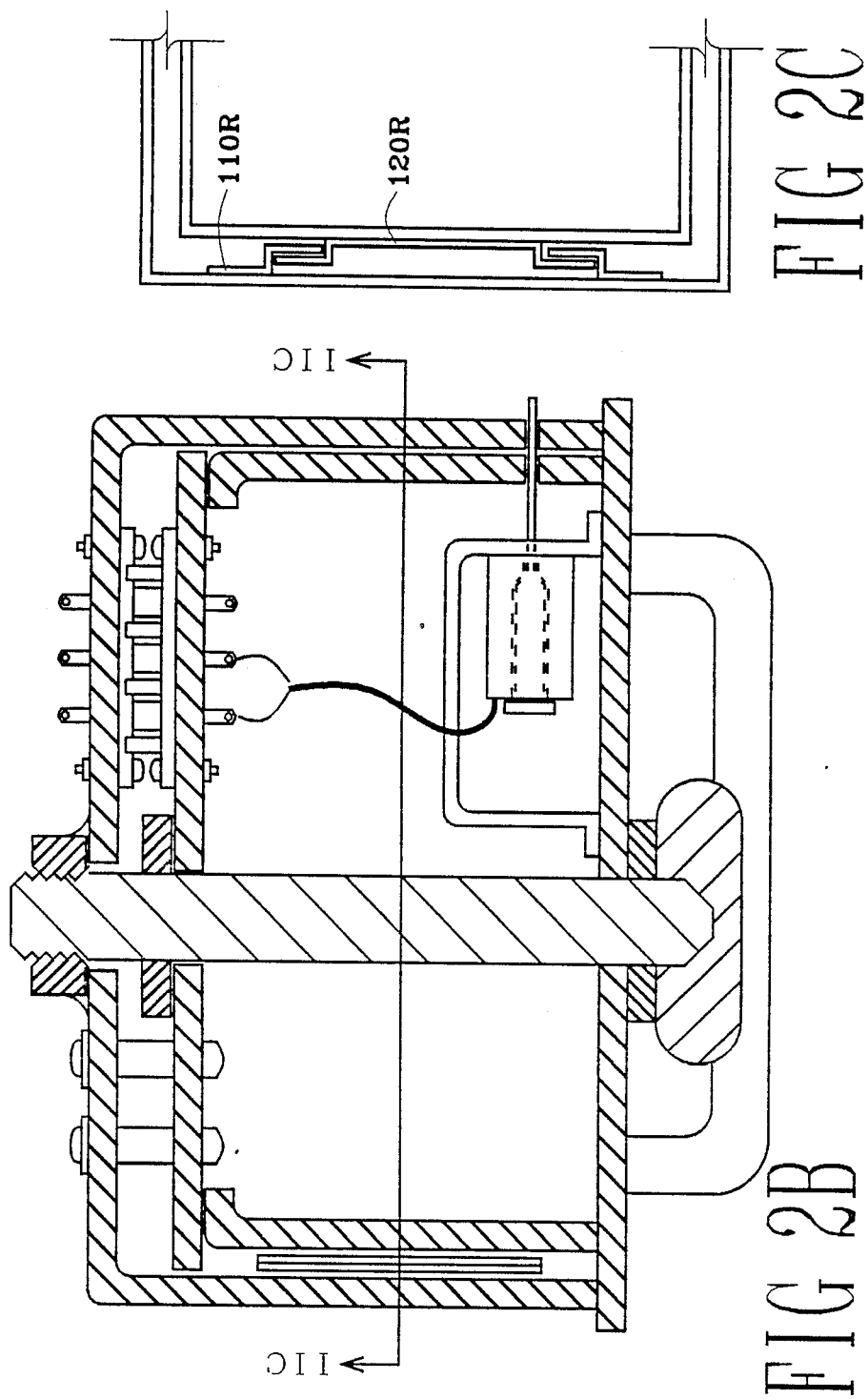
FIG. 2B is a side view in section along lines II—II of FIG. 1 showing the cartridge after installation in the final stop position.
FIG. 2C is a fragmentary view along lines IIC of FIG. 2B showing opposed guide rails between the cartridge and the main computer system.

The cartridge stops sliding inward when threaded tip 122T strikes against threaded aperture structure 110A (see FIG. 2A). A stop means formed by threaded end 122T and internal threads in aperture structure 110A, defines the initial stop position of the cartridge.

When the cartridge is in the initial stop position, opposed electrical connectors 110C and 120C are not fully engaged. Tip 122T of bolt 122 extends beyond interface plate 120P to protect the connectors from the stopping force caused by the initial stop. Preferably, tip 122T is long enough to prevent the opposed metal contacts 110M and 120M in connectors 110C and 120C from even touching. The connectors are secured to the interface plate 120P and interface wall 110P by suitable fastening devices such as small bolts 110B and 120B. One connector may be floating or loosely secured to allow a slight displacement of the connector as the opposed contacts engage. This displacement permit the contacts to self aline during installation of the cartridge. If desired the contacts may have resilient capability for applying inter-contact pressure after the cartridge is fully installed.

FINAL CARTRIDGE POSITION (FIG. 2B)

During the final mounting stage, the operator engages threaded end 122T into threaded aperture 110A by twisting knob 122K positioned on the accessible end of securing rod 122. Knob 122K extends from the operator accessible side or front panel 120F of the cartridge housing. By turning knob 122K and shaft 122, the operator causes the engaged threads to slowly pull the cartridge further into the cavity against interface wall 110P of the cavity lining (see FIG. 2B) and rear wall 110R of the cavity lining. Electrical connectors 110C and 120CD engage fully as the cartridge is pulled to the rear of the cavity.

CARTRIDGE LOCKING DEVICE (FIG. 2)

Locking solenoid 230 is mounted on frame member 230F at the upper end of the solenoid. Locking solenoid 230 has a locked state and an unlocked state. In the unlocked state the cartridge is either removed from the cavity or the power to the cartridge is off causing the solenoid to be denergized. In the locked state the cartridge is installed in the cavity and the solenoid is energized by power from the connectors through wire 230W.

In the unlocked state locking pin 230P in the retracted position within the solenoid (see FIG. 2A), permitting the cartridge to be installed into the cavity. Pin 230P is spring biased toward the retracted position by retracting spring 230S, and rests against the lower portion of frame 230F. In the locked state locking pin 230P in the extended position (see FIG. 2B), extending upward through locking hole 120L in the cartridge housing and through locking hole 110L in the top wall of the cavity lining.

The locking holes are in registration when the cartridge is in the final position. When the cartridge is powered-up by the main unit, the pin extends through the locking holes to prevent the cartridge from being removed from the cavity during operation session. When the power to the cartridge is off, pin 230P retracts and the cartridge may be removed from the main unit. At the termination of each work session, the system is powered down causing pin 120I to retract into the solenoid.

INDEXING STRUCTURE (FIGS. 2 and 3)

The remote work location may employ several main computer units and dozens of data base cartridges. Because of hardware and software upgrading in both the main computer unit and the cartridge drive; some drives and data versions may be compatible only with certain main computers. In order to prevent installation of a cartridge into an incompatible main computer, a suitable indexing or keying structure is provided on cavity interface wall 110P and on cartridge interface plate 120P (see FIG. 2A). Indexing pins 110K extending from interface wall 110P engage corresponding indexing holes 120K in interface plate 120P. For compatible computers and cartridges the pins and holes are in registration, and the cartridge may be mounted in that unit (see FIG. 2B). If the pins and holes are out of registration, the cartridge can not be mounted.

The status of a particular cartridge may change and require the modification of certain holes in interface plate 120P or pins on interface wall 110P (see FIG. 3). Removing pins or adding holes disables the keying and increases the compatibility of the cartridge with the main computer units. Adding pins or plugging holes enables the keying and decreases the number of compatible main computers.

Each keying pin has a pin or nut portion 310N extending from interface wall 110P and a bolt portion 310B inside the main unit for securing the pin to interface wall 110P. Any pin may be removed by unscrewing the nut portion from the bolt portion.

The status of the cartridge may likewise be altered by changing the number of holes on interface plate 120P. Any keying hole 120K may be blocked by a plug or bolt 320B extending through the keying hole from the cartridge side of the interface plate, and a nut 320N on the other side of the interface plate for securing bolt 320B. Preferable the head or the bolt is covered with a cushioning material such as rubber cover 320C for minimizing the strike force of the cartridge against interface wall 110P.

INDENT (FIG. 4)

The cartridge is provided with an indented region 420I in the cartridge housing (see FIG. 4, bottom view) formed by interface plate 120P and the rear portion 420R of the side surface of the cartridge housing. Indent 420I provides a partially protected area for the interface structures on the cartridge, such as securing bolt tip 122T and electrical connector 120C. The cartridge may be placed on a table using any surface of the housing as the base without disturbing the interface structures.

The front portion 420F of the side surface is larger than rear portion 420R which permits front portion 420F to function as a base when the cartridge is placed on the side surface. The front-to-rear dimension of front portion 420F is greater than the front-to-rear dimension of rear portion 420R. Likewise, back surface 420B is larger than interface plate 120I which permits back surface 420B to function as a base. The left-to-right dimension of back surface 420B is greater than the left-to-right dimension of interface plate 120I.

SPECIFIC EMBODIMENT

The following particulars of data cartridge are given as an illustrative example.

Cartridge Housing: height 7.25 inches, width 8.68 inches, depth 6.2 inches.

Indent 420I: height 7.25 inches, width (interface plate 120I) 2.45 inches, depth (rear portion 420R) 2.18 inches.

Securing Rod 122: hardened steel bolt, ⅜ inch diameter, 8 inches long.

Indexing structure: keying hole 120K 0.41 inches diamter, keying pin 110P 0.25 inch diameter, 1 inch long.

The values and dimensions given above are not intended as defining the limitations of the invention. Numerous other configurations are possible.

INDUSTRIAL APPLICABILITY

It will be apparent to those skilled in the art that the remaining objects of this invention have been achieved by providing a removable data cartridge with keying and locking features.

CONCLUSION

Clearly various changes may be made in the structure and embodiments shown herein without departing from the concept of the invention. For example the position of the indexing pins and hole may be reversed. The pins may extend from the cartridge interface plate, and the cavity interface wall may have the holes. Further, the locking structure may be located on the main computer with the locking pin extending into the cartridge housing to secure the cartridge during operation.

Further, features of the embodiments shown in the various Figures may be employed with the embodiments of the other Figures.

Therefore, the scope of the invention is to be determined by the terminology of the following claims and the legal equivalents thereof.

I claim as my invention:

1. A data cartridge means which may be removably installed by an operator into a data station on a computer, the data cartridge means comprising:

housing means having an operator accessible side and a computer interface side;
   data means within the housing means for containing a data storage medium and a data drive means for accessing the data storage medium;
   interface means within the housing means for interfacing with the data station on the computer;
   initial stop means extending from the interface means defining an initial stop position for the data cartridge means during the installation thereof into the data station of the computer;
   securing means rotatably mounted within the interface means and extending from the operator accessible side to the computer interface side;
   threaded end formed on the securing means extending from the computer interface side for engaging a corresponding threaded aperture on the computer;
   knob means extending from the operator accessible side for permitting the operator to rotate the securing means causing the threaded end of the securing means to engage the threaded aperture on the computer and displace the data cartridge means slowly into the data station for securing the data storage means;
   final stop means defining a final stop position of the data cartridge means within the data station; and
   electrical connector means on the computer interface side of the interface means which engage corresponding electrical connector means on the computer proximate the data station for receiving electrical power to energizing the data cartridge means and for data transfer between the data means and the computer, the electrical connector means not fully engaged when the data cartridge means is in the initial stop position and fully engaged when the data cartridge means is in the final stop position.

2. The data cartridge means of claim 1 wherein the initial stop means is formed by the foremost threads on the threaded end of the securing means.

3. The data cartridge means of claim 1 wherein the final stop means is formed by the electrical connector means on the computer interface side of the interface means.

4. The data cartridge means of claim 1 further comprising a locking means mounted within the data cartridge means for preventing removal of the data cartridge means from the data station on the computer.

5. The data cartridge means of claim 4 wherein the locking means comprises an electrical solenoid with a sliding locking pin therein which is retracted when the solenoid is not energized and which is extended through the housing means into the data station when the solenoid is energized for preventing removal of the data cartridge means.

6. The data cartridge means of claim 5 wherein the solenoid is energized by the electrical power provided by the computer through the electrical connector means.

7. The data cartridge means of claim 6 wherein the solenoid is automatically energized when the data cartridge means reaches the final stop position, and automatically de-energized when the data cartridge means reaches the initial stop position.

8. The data cartridge means of claim 1 wherein the interface means within the housing means has an indent region on the computer interface side which contains the electrical connectors means and the threaded end of the securing means.

9. The data cartridge means of claim 8 wherein computer interface side of the interface means is formed by an interface plate containing the electrical connector means and the threaded end.

10. The data cartridge means of claim 9 wherein the indent region extends vertically along the computer interface side of the interface means.

11. A computer system having a secured data base, comprising:
    computer unit having an operator accessible portion with a data transfer station thereon;
    cartridge means which may be removably mounted on the computer unit at the data transfer station, the cartridge means having an operator accessible side and a computer interface side,
    data means within the cartridge means for containing a data storage means and a data drive means for accessing the data stored in the data storage means;
    interface means within the cartridge means for interfacing with the data transfer station on the computer unit;
    initial stop means defining an initial stop position between the cartridge means and the data transfer station during the mounting of the cartridge means;
    rigid securing shaft extending through the cartridge means from the operator accessible side to the computer interface side;
    knob on the operator accessible end of the securing shaft;
    first threaded structure on the computer interface end of the securing shaft;
    securing aperture on the computer unit proximate the data transfer station;
    second threaded structure formed in the securing aperture for engaging the first threaded structure on the securing shaft as the knob is rotated causing the cartridge means to be slowly moved toward the securing aperture for securing the cartridge means into the data transfer station;
    final stop means defining a final stop position of the cartridge means within the data transfer station;
    first electrical connectors means on the computer interface side of the cartridge means; and
    second electrical connectors means on the computer unit proximate the data transfer station for engaging the first electrical connectors means on the cartridge means to transfer data between the computer unit and the data means on the cartridge means and for providing electrical power to the cartridge means;
    the electrical connector means not fully engaged when the cartridge means is in the initial stop position and fully engaged when the cartridge means is in the final stop position.

12. The computer system of claim 11 wherein the initial stop means is formed by the threads on the first threaded structure of the securing shaft.

13. The computer system of claim 11 wherein the final stop means is formed by the electrical connector means on the computer interface side of the interface means.

14. The computer system of claim 11 wherein at least one of the electrical connector means is loosely mounted to permit alinement of the electrical connector means as the cartridge means is displaced by the engaged threaded structures.

15. The computer system of claim 11 wherein at least one of the electrical connector means is resilient.

16. The computer system of claim 11 wherein the data transfer station is a cavity in the computer unit.

17. The computer system of claim 16 wherein the cavity and the cartridge means have cooperating air vent means for providing a flow of air from the computer unit and through the cartridge means.

18. The computer system of claim 16 wherein the cavity and the cartridge means are formed of an electrically conductive material for providing a double electrical shield for the data means within the cartridge means.

19. The computer system of claim 16 further comprising opposed guide rail means mounted on the data station cavity and on the cartridge means for guiding the cartridge means into the data transfer station in the computer unit.

20. The computer system of claim 11 further comprising a locking means mounted within the cartridge means for preventing removal of the cartridge means from the data transfer station on the computer unit.

21. The computer system of claim 20 wherein the locking means comprises:
    an electrical solenoid with a sliding locking pin therein which is retracted when the solenoid is not energized and which is extended into the data station when the solenoid is energized for preventing removal of the cartridge means.

22. The computer system of claim 21 wherein the solenoid is energized by the electrical power provided by the computer unit through the engaged electrical connector means.

23. The computer system of claim 22 wherein the solenoid is automatically energized when the cartridge means reaches the final stop position, and automatically de-energized when the cartridge means reaches the initial stop position.

24. The computer system of claim 11 further comprising keying means for mechanically coding the cartridge means with the computer unit.

25. The computer system of claim 24 wherein the keying means comprises;
    pin means extending from the data transfer station; and
    port means formed in the computer interface side of the interface means for receiving the pin means.

26. The computer system of claim 25 wherein the pin means may be removed and the port means may be in order to change the mechanical code.

* * * * *